United States Patent
Sasatani

(10) Patent No.: US 9,053,139 B2
(45) Date of Patent: *Jun. 9, 2015

(54) FORMING CONFIGURATION INFORMATION ABOUT COMPONENTS OF SYSTEMS WHICH INCLUDE COMPONENTS FOR WHICH ACQUISITION OF CONFIGURATION INFORMATION IS RESTRICTED

(71) Applicant: International Business Machines Corporation, Armonk, NY (US)

(72) Inventor: Yohkichi Sasatani, Yamato (JP)

(73) Assignee: International Business Machines Corporation, Armonk, NY (US)

( * ) Notice: Subject to any disclaimer, the term of this patent is extended or adjusted under 35 U.S.C. 154(b) by 194 days.

This patent is subject to a terminal disclaimer.

(21) Appl. No.: 13/769,932

(22) Filed: Feb. 19, 2013

(65) Prior Publication Data

US 2013/0159358 A1 Jun. 20, 2013

Related U.S. Application Data

(63) Continuation of application No. 13/515,156, filed as application No. PCT/JP2010/070301 on Nov. 15, 2010.

(30) Foreign Application Priority Data

Dec. 18, 2009 (JP) ................................. 2009-288159

(51) Int. Cl.
*G06F 15/173* (2006.01)
*G06F 15/177* (2006.01)
(Continued)

(52) U.S. Cl.
CPC ........... *G06F 17/30312* (2013.01); *B82Y 10/00* (2013.01); *B82Y 30/00* (2013.01);
(Continued)

(58) Field of Classification Search
CPC .............................. G06F 8/71; H04L 63/1416

USPC .......... 709/224, 203, 217, 219, 221; 707/741; 726/24

See application file for complete search history.

(56) References Cited

U.S. PATENT DOCUMENTS

| | | | |
|---|---|---|---|
| 2009/0157872 A1* | 6/2009 | Pinkston et al. | 709/224 |
| 2009/0165137 A1* | 6/2009 | Yoo et al. | 726/24 |
| 2010/0070448 A1* | 3/2010 | Omoigui | 707/741 |

FOREIGN PATENT DOCUMENTS

| | | |
|---|---|---|
| CN | 1756189 A | 4/2006 |
| CN | 101321084 A | 12/2008 |

(Continued)

OTHER PUBLICATIONS

U.S. Appl. No. 13/515,156, Feb. 18, 2013, 2 pages.

(Continued)

*Primary Examiner* — Quang N Nguyen
(74) *Attorney, Agent, or Firm* — Francis Lammes; Stephen J. Walder, Jr.; Jeffrey S. LaBaw

(57) ABSTRACT

A mechanism is provided for managing configuration information about components of a management target system. Identification is made of the existence of a first component from configuration information about one or more other components except the first component. Pattern data is stored for analogizing configuration information about a component for which acquisition of the configuration information is restricted, the pattern data being associated with a set of one or more conditions and attribute values. Pattern data is retrieved whose configuration information about a component related to the first component, among the one or more other components, satisfies the set of conditions. Analogized configuration information is formed about the first component using attribute values associated with the retrieved pattern data.

13 Claims, 9 Drawing Sheets

(51) Int. Cl.
*G06F 17/30* (2006.01)
*B82Y 10/00* (2011.01)
*B82Y 30/00* (2011.01)
*H01L 21/02* (2006.01)
*H01L 29/12* (2006.01)

(52) U.S. Cl.
CPC .... *H01L21/02422* (2013.01); *H01L 21/02491* (2013.01); *H01L 21/02543* (2013.01); *H01L 21/02551* (2013.01); *H01L 21/02557* (2013.01); *H01L 21/02568* (2013.01); *H01L 21/02628* (2013.01); *H01L 29/127* (2013.01)

(56) References Cited

FOREIGN PATENT DOCUMENTS

| | | |
|---|---|---|
| JP | 05-183549 | 7/1993 |
| JP | 09-186716 | 7/1997 |
| JP | 11187061 A | 7/1999 |
| JP | 2001-217832 | 10/2001 |
| JP | 2002-101125 | 4/2002 |
| JP | 2002368743 A | 12/2002 |
| JP | 2004-086729 | 3/2004 |
| JP | 2004086729 A | 3/2004 |
| JP | 2006-048113 | 2/2006 |
| JP | 2006-202283 | 8/2006 |
| TW | 200816049 A | 4/2008 |

OTHER PUBLICATIONS

International Search Report and Written Opinion dated Jan. 11, 2011, International Application No. PCT/JP2010/070301, 9 pages.

"Configuration Discovery and Tracking Terminology", IBM Corporation, IBM Redbooks Deployment Guide Series: IBM Tivoli Change and Configuration Management Database Configuration Discovery and Tracking, vol. 1, Nov. 2006, pp. 41-64.

"IBM Tivoli Common Data Model: Guide to Best Practices", IBM Corporation, IBM Red Paper, IBM Form No. REDP-4389-00, Nov. 2007, pp. 2-7.

Clugston, S.F. et al., "Implementation of Configuration Control for Nuclear Safety-related Piping", Proceedings of the American Power Conference; (USA); Journal vol. 51; Conference: American Power Conference, Chicago, IL (USA), Apr. 1989, 1 page.

Darst, Melanie R. et al., "Drying of Floodplain Forests Associated with Water-Level Decline in the Apalachicola, Florida Interim Results, 2006", Northwest Florida water Management District and the Florida Department of Environmental Protection, Open-File Report 2007-1019, 2006, 19 pages.

Dori, Dov et al., "A Temporal Database with Data Depedencies a Key to Computer Integrated Manufacturing", Int. J. Computer Integrated Manufacturing, vol. 9, No. 2, Mar., 1996, 16 pages.

Michio, Kikama, "Information infrastructure for manufacturing industry in the future. What is "product data control system PDM"?", Computer Report—Tokyo, Mar. 1995, vol. 35, No. 3, Mar. 1995, 9 pages.

Venkatesh, V. C., "Computerized Machinability Data", Automach Australia '86, International Standard Book Number: 0-87263-231-8, First Edition, First Printing, Sydney, Australia, May 26-29, 1986, 16 pages.

Yamaguchi, Nobuhiko, "Role Played by Configuration Management in ICT Hosting", Unisys Technology Review, vol. 29 No. 1, May 31, 2009, 8 pages.

\* cited by examiner

FORMING CONFIGURATION INFORMATION ABOUT COMPONENTS OF SYSTEMS WHICH INCLUDE COMPONENTS FOR WHICH ACQUISITION OF CONFIGURATION INFORMATION IS RESTRICTED

BACKGROUND

The present invention generally relates to configuration management of a system. More particularly, the present invention relates to a method, device and program for forming a CI (configuration item) corresponding to a system component for which discovery of configuration information is restricted.

Recently, as utilization of information technology (IT) is becoming essential for success in business, it is more and more important to effectively utilize an IT system to provide IT services. However, for a lot of companies, "complexity of an IT system" and "operation management cost" are heavy burdens. In such a situation, ITIL (Information Technology Infrastructure Library) (a trademark of the British government) has attracted attention.

ITIL is a collection of best practices for realizing IT service management. ITIL includes service support and service delivery, and the service support includes configuration management. Configuration management is a process for recognizing components of a management target system, maintaining, updating and checking information about the components, and performing auditing.

In the context of an ITIL framework, it is recommended to manage components using a configuration management database (CMDB). A CMDB is a database for recording the relations between at least one attribute of a component and other components. With the CMDB, an ability of detecting (discovering) and updating (tracking) information about the components (configuration information) can be obtained.

As a background art, for example, Published Unexamined Patent Application No. 2004-0086729 discloses that responses to a ping command and SNMP information are acquired so that a result of analysis of a state close to the actual network configuration can be obtained from combinations of the response and the SNMP information. A network configuration information search section confirms the existence of each target device of the network by its response to the ping command, stores the confirmation result into a database as response result data. It also acquires SNMP information from each device, and stores the SNMP information into the database as search result data, together with information about whether the SNMP information has been acquired or not. A network configuration information analysis section analyzes the response result data and the search result data, and classifies the existence possibility of each device depending on whether the response and the SNMP information have been acquired or not. As for devices from which the SNMP information has been acquired, a corresponding connection relation is set. As for devices from which the SNMP information has not been acquired, a connection relation is set in consideration of other information such as an IP address.

As another background art, Published Unexamined Patent Application No. 2001-0217832 discloses that a physical device configuration inside a network node is automatically detected in a network environment implemented with SNMP. An Internet Control Message Protocol (ICMP) echo request is transmitted from an administrator terminal implemented with an SNMP manager to each network device in a network node, and devices in an operating state are detected according to responses to the request. To the SNMP agent of each of the detected devices, a request for transfer of information stored in the management information base within the device is transmitted. The classifications of the devices existing in the network node are detected from the information stored in the management information bases returned. On the basis of acquired physical address and IP address correspondence information, a connection-destination device of each port of devices having a bridge function is recognized at an IP level.

As another background art, Published Unexamined Patent Application No. 2006-0202283 discloses that an SNMP request for accessing an object identifier is distinguished. A method for extracting a monitored device connected via a network and related information with the use of an SNMP protocol is disclosed. By accessing a memory, access information for accessing a monitored device is acquired. The access information includes: (1) one kind of status to be acquired from the monitored device, and (2) an access character string to be used to acquire the one kind of status information from the monitored device. The access character string is analyzed to judge whether the access character string is stored. When the access character string is stored, then it is judged whether the access character string includes a predetermined character string.

BRIEF SUMMARY

In a system using a CMDB, there may be a case where a discovery-restricted component exists in a management target system. In such a case, there is a possibility that sufficient configuration information about such a component cannot be collected because of the discovery restriction. As such a component, a hardware/software element related to a computer which has been installed in the system and has not been registered, a computer restricting access from a server which executes discovery (hereinafter referred to as a discovery server), a computer in which an agent program required for discovery has not been installed, or the like is conceivable. This problem cannot be solved by any of the above background arts.

Thus, one of the objects of the present invention is to provide an improved method, program and system for managing configuration information.

In order to achieve the above object, there is provided a system for forming configuration information about components of a system which includes a first component for which acquisition of configuration information is restricted. The system is provided with: an identification section identifying the existence of the first component from configuration information about one or more other components except the first component; a storage section storing pattern data for analogizing configuration information about a component for which acquisition of the configuration information is restricted, the pattern data being associated with a set of one or more conditions and attribute values; a search section retrieving pattern data whose configuration information about a component related to the first component, among the one or more other components, satisfies the set of conditions, from the storage section; and a formation section forming analogized configuration information about the first component using attribute values associated with the retrieved pattern data.

Preferably, the system is further provided with a configuration management database storing the configuration information about the one or more other components and the analogized configuration information about the first component as CIs (configuration items).

Preferably, a CI expressing the existence of the first component is formed in the configuration management database in response to the existence of the first component having been identified. Further preferably, when multiple CIs expressing the existence of the first component are formed, the multiple CIs are integrated in response to the analogized information having been formed.

Preferably, the existence of the first component is identified from connection information related to the first component, among the configuration information about the one or more other components.

The analogized configuration information is stored together with data indicating that the configuration information is analogized information. It is preferable that a display processing section causing the analogized configuration information about the first component to be displayed on a display device together with the configuration information about the one or more other components is further provided. Furthermore, the display processing section causes the analogized configuration information about the first component to be displayed on the display device in a manner so that it is shown that the configuration information is analogized configuration information.

It is preferable that, on condition that actual configuration information about the first component has been acquired, the analogized configuration information is replaced with the actual configuration information. In this case, it is preferable that the display processing section updates the information displayed on the display device.

The summary of the present invention has been described above as a system for managing configuration information. However, the present invention can be grasped as a method, program or a program product. The program product includes, for example, a storage medium storing the program described above or a medium for transmitting the program.

It should be noted that the above summary of the invention has not enumerated all the necessary characteristics of the present invention. A combination or sub-combination of the components can be also the invention.

DETAILED DESCRIPTION

Figure 1:
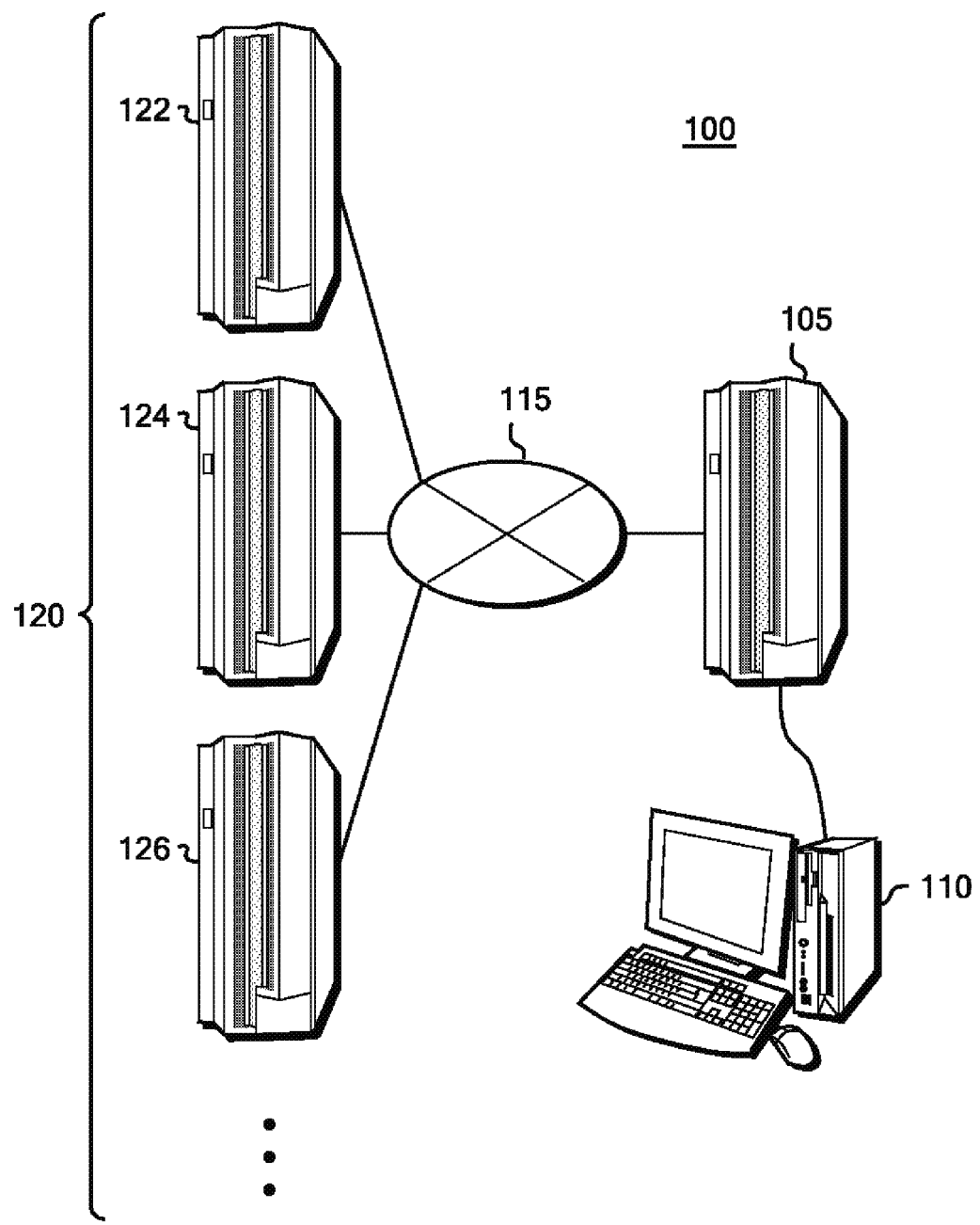
FIG. 1 is a diagram showing the outline of the whole information processing system in an embodiment of the present invention.

A best mode for carrying out the present invention will be described below in detail on the basis of drawings. However, the embodiment below does not limit the invention according to the claims, and all the combinations of features described in the embodiment are not necessarily essential for the solving means of the invention.

Furthermore, the present invention can be practiced in a lot of different aspects, and should not be interpreted as being limited to the contents of the description of the embodiment. Furthermore, it should be noted that all the combinations of features described in the embodiment are not necessarily essential for the solving means of the invention. The same elements are given the same reference numerals through the whole description of the embodiment.

First, main terms thought to be necessary to understand the embodiment of the present invention will be described.

CMDB (configuration management database): An integrated database for storing and managing information about components of a management target information system. A CMDB records at least one predetermined attribute of each CI and relations with other CIs. The CMDB supports a user to understand relations among components and enables the user to manage the configuration of the components. The CMDB is the core of an ITIL framework configuration management process. Though the CMDB is conceptually a database, it can physically take various forms, such as a database system and a spreadsheet of spreadsheet software. By utilizing the CMDB, an administrator can easily understand CI configuration and relations among CIs.

CI (configuration item): Data corresponding to a component belonging to a target range of IT service management, and is a basic management target unit in IT service management. For example, targets to be managed as CIs include system resources including hardware and software, facilities required for providing IT services, documents such as regulations on operation of IT services, work procedures and configuration diagrams, services such as maintenance works for hardware or software, processes, human resources and the like but are not limited thereto. That is, not only hardware and software which actually exist but also connection relations, services and processes which logically exist can be managed as CIs. Various types of CIs will be managed by the CMDB in the future. Each CI can be expressed on the CMDB as an instance of a data model described below. Examples of CI include an instance of static data or an instance of a Java® (a trademark of Sun Microsystems, Inc.) class. An implemented instance of a Java® class is stored into the CMDB, for example, by a mechanism for making an instance of a Java® class permanent and storing it into a hard disk, which is called Java® Data Objects (JDO). By doing this, a created instance of a Java® class does not disappear even if a computer system is powered down once. When the computer system is powered on next time, the instance is read from a storage device (for example, a hard disk) and developed on the main memory, and becomes an instance of Java® class which can be changed or deleted by a Java® program. In the description below, there may be a case where description is made on the assumption that a CI is implemented in the CMDB as an instance.

CI model: A schema for defining a CI, and a data model which provides consistent definitions of managed CIs and relations among the CIs. Specifically, the data model defines predetermined attributes of a CI and relations with other CIs (manufacture devices, processes and the like). As an example of the data model, a data model for a configuration management database "CDM (Common Data Model)" proposed by IBM is given. In the "CDM", 31 kinds of sections (categories such as Computer System, Database, Application and Process), 636 kinds of classes (basic data model units; belonging to one or more sections), 2609 kinds of attributes (data attribute information; belonging to one class), seven kinds of interfaces (high-frequency-use attribute groups: belonging to multiple sections), 57 kinds of relationships, and 49 kinds of data types (classifications of data) are defined as of the year 2006. Implementation of the CDM is performed, for example, on the basis of Unified Modeling Language (UML). For the details of the CDM, refer to IBM RED PAPER (DRAFT version) IBM Tivoli Common Data Model: Guide to Best Practices (IBM Form Number REDP-4389-00), pp. 2-7, November 2007 (Non Patent Literature 1).

Attribute: Identifies and describes individual CIs when CIs are managed. Examples of the attributes include a CI name (a name for identifying a CI), a product number (ID) (a number for individually identifying a particular CI entity, for example, a production number, a serial number and the like), a model number (a CI model number given by a provider), the term of guarantee (the term of guarantee by a CI provider), a location (a place where a CI exists, for example, a PC installation place, an archive of software, a medium storage place, a site providing services or the like), a person in charge of possession (the name of a person in charge of CI management), a provider (a CI developer or provider), license (a license number, the number of licenses and the like), a CI status (the current status, for example, during operation, during test or out of order, or a future status), but are not limited thereto. Furthermore, it is also possible for a user or an administrator to freely customize the attributes.

Relation: An attribute indicating relation between CIs. The relation can be defined by a data model similarly to the case of a CI. As examples of relations, assigns, canConnect, canUse, connectAt, connects, controls, deployedOn, Located, Managed, Owned, provides, runAt, uses and usedBy are defined in the Common Data Model.

FIG. 1 is a diagram showing the outline of the whole information processing system in the embodiment of the present invention. The information processing system 100 according to the embodiment of the present invention includes a discovery server 105, an operator console 110 and a management target system 120. In the embodiment of the present invention, the management target system 120 includes application servers 122, 124 and 126.

Each computer of the discovery server 105 and the management target system 120 is connected via a network 115. That is, the network 115 is a communication path connecting the discovery server 105 and the application servers 122, 124 and 126, and can be realized by a LAN (local area network) or the Internet. It does not matter whether the network 115 is wiredly or wirelessly connected. The network 115, which is a LAN or the Internet, connects systems to each other using TCP/IP which is a communication protocol well known to one skilled in the art.

Figure 2:
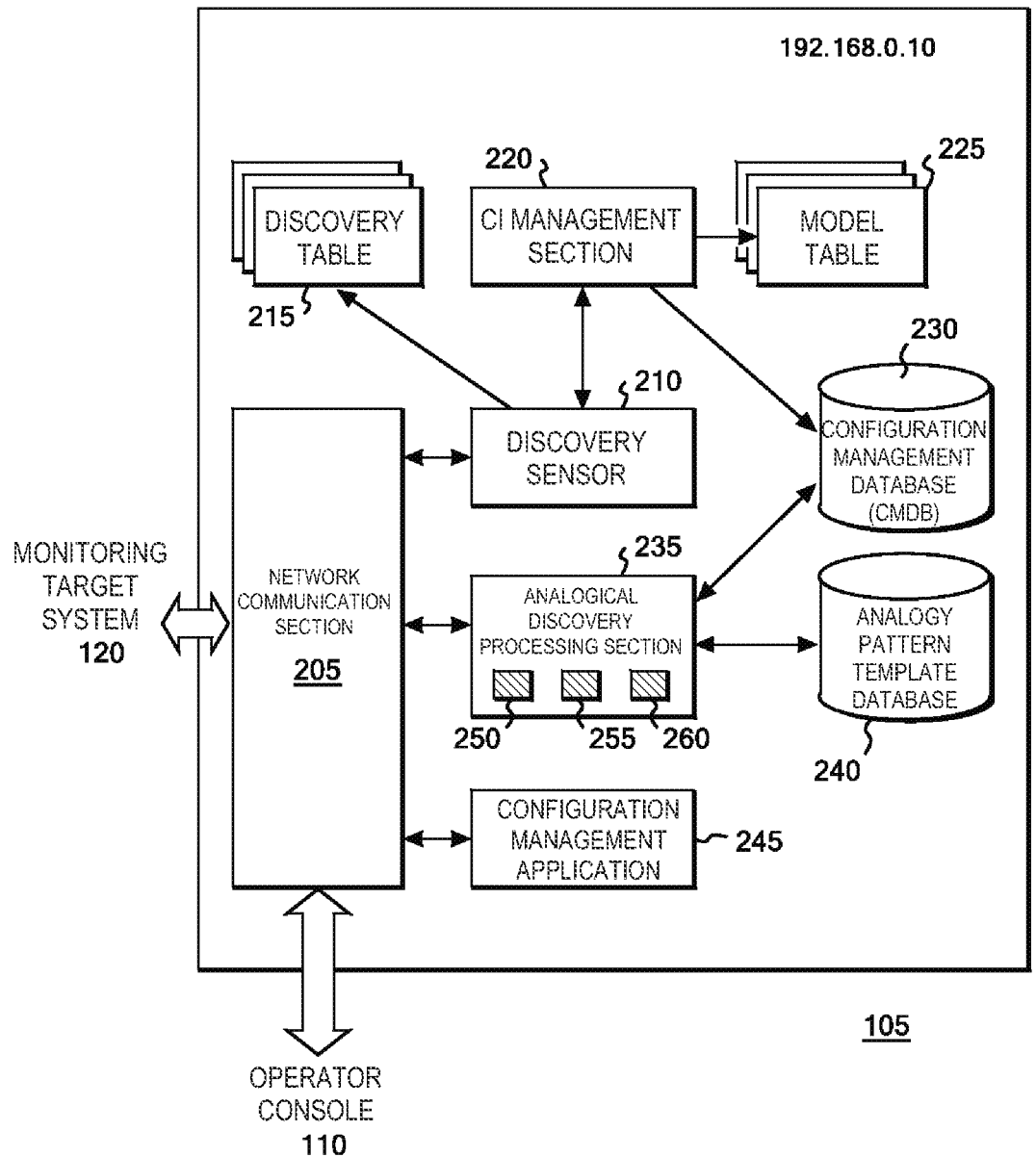
FIG. 2 is a functional block diagram of a discovery server in the embodiment of the present invention.

FIG. 2 is a functional block diagram of the discovery server 105 in the embodiment of the present invention. Each of the elements shown in the functional block diagram of FIG. 2 can be realized by, in the information processing device having the hardware configuration illustrated in FIG. 10, causing a CPU 1 to read a computer program, such as "Tivoli Change and Configuration Management Database" (hereinafter IBM Tivoli CCMDB), which is an IBM software product for supporting construction of the operating system and a CMDB stored in a hard disk device 13 and controlling an operation process on the basis of the CMDB, after loading the computer program onto a main memory 4, and causing hardware resources and software resources to cooperate with each other.

In IBM Tivoli CCMDB, it is possible to identify 300 kinds of components in a distributed network environment, such as a server, client, operating system (OS), middleware (Web, AP, DBMS, LDAP and the like), package software, management tool, network device and storage device and, furthermore, automatically discover and update information about each component, for example, information about the configuration of a computer, information about applications operating on each computer, configuration information about a network attached storage (NAS) and the like connected to each computer, and configuration information about a storage area network (SAN) and the like directly connected to a network. For the details of discovery and tracking in IBM Tivoli CCMDB, refer to IBM Redbooks Deployment Guide Series: IBM Tivoli Change and Configuration Management Database Configuration Discovery and Tracking v1.1, pp. 41-64, November 2006 (Non Patent Literature 2).

The discovery server 105 of the embodiment of the present invention is provided with a network communication section 205, a discovery sensor 210, a discovery table 215, a CI management section 220, a model table 225, a CMDB (configuration management database) 230, an analogical discovery processing section 235, an analogy pattern database 240 and a configuration management application 245. It should be noted that these may be implemented on a single computer or may be distributedly implemented on multiple computers.

The network communication section 205 is a communication interface for communicating with the management target system 120 and the operator console 110. Acquisition of configuration information about the components of the management target system 120, acquisition of information about an operation by an operator at the operator console 110, and sending-out of display information to the operator console 10 are realized through the network communication section 205.

The discovery sensor 210 executes detection (discovery) of information about the components of a CMDB management target system. In the embodiment of the present invention, the components of the management target system are connected to the discovery server via a network. The method for collecting information about the components differs depending on a management target. Basically, however, a computer system managing a CMDB periodically accesses a remote interface for management using SSH (Secure Shell) or the like to read a configuration file on the OS or configuration information, or the computer system managing the CMDB executes a configuration confirmation command. Therefore, in the embodiment of the present invention, it is not necessary to install an agent program into the components of the management target system. However, it should be noted that the present invention can also be practiced in the case where the agent program is installed in a part or all of the components of a management target system. The discovery sensor 210 hands detected information over to the CI management section 220.

The discovery table 215 stores discovery instances. The discovery instances are used to detect configuration information about management target components by a discovery sensor. The discovery instance can be implemented, for example, with an instance of static data or an instance of a Java® (a trademark of Sun Microsystems, Inc.) class. The discovery instance is also called a discovery policy. The discovery instance includes information about collection targets, which are the range of the discovery sensor acquiring configuration information, attributes to be collected, and relations to be collected. The collection targets can be specified, for example, with the use of subnet IP addresses, a range of IP addresses, individual IP addresses, MAC addresses, device identifiers, host names or a database name, or a combination of these. As another aspect, the collection targets may be schedule management databases (not shown) connected to computer systems via a network. The schedule management database stores, for example, data about process management for using a device. As still another aspect, the collection targets may be databases (not shown) storing batch processing definition files. When the collection targets are the databases storing the batch processing definition files, the discovery sensor performs detection by reading the contents of the batch processing definition files. The batch processing definition file stores, for example, data about in what order devices should be used.

The administrator of the discovery server can arbitrarily set a detection target. The range of detection can be specified, for example, by domain names, IP addresses, MAC addresses, device identifiers or database names, or combination of these. When management target components are, for example, hardware or software, configuration information about each piece of the hardware or software is detected. The detected configuration information can be configuration information about a new component, or an updated attribute or relation value of an existing component. The new component is a component which has been detected by the discovery sensor but is not registered yet with the CMDB as a CI at that time point. The existing component is a component the CI of which is already registered with the CMDB. The discovery sensor detects information about components of the management target system in accordance with the discovery instances stored in the discovery table.

The CI management section 220 receives the information about the components of the management target system from the discovery sensor and performs processing. Specifically, the CI management section 220 judges whether the received information is configuration information about a new component or an updated attribute or relation value of an existing component by referring to the CMDB. The judgment can be performed by comparing the "CI names" of CIs stored in the CMDB with the information about the component.

If the received information is determined to be about a new component, then the CI management section 220 creates a set of data indicating a predetermined attribute of the component and relations with other components from the received information in accordance with a data model stored in the model table 225. The set of data can be implemented, for example, with an instance of static data or an instance of a Java® (a trade mark of Sun Microsystems, Inc.) class. An example of the set of data is a CI. The set of data is stored in the CMDB 230. The set of data may include the attribute and the relations in one CI, or it is also possible to have the attribute in a CI instance, and store the CI instance and a relation instance separately in the CMDB 230.

If the received information is determined to be an updated attribute or relation value of an existing component, then the CI management section 220 updates the attributes and relations of a CI corresponding to the existing component with the information to realize tracking. That is, the CI management section 220 reflects the updated attribute or relation value of the existing component on the CI corresponding to the component which is stored in the CMDB. Such reflection may be performed by replacing all the previous attribute or relation values of the CI with the received information or by replacing only an attribute or relation value that is different from the received information, among the previous attribute or relation values of the CI.

The model table 225 includes a CI model which is a data model. The data model is used when the CI management section 220 creates a set of data indicating a predetermined attribute of a CI corresponding to a component of the management target system and relations with other components. It should be noted that, in the embodiment of the present invention, what corresponds to connection relations among the components of the management target system is also included as the data model.

The CMDB 230 stores a CI formed with the use of the CI model described above. The CMDB 230 also stores an "unknown CI" and an "analogized CI" which are to be described later. The CIs stored in the CMDB 230 of the embodiment of the present invention are in accordance with the Common Data Model (CDM) in principle. Attributes which are especially required for description of the embodiment of the present invention will be explained with reference to the table below.

TABLE 1

| Attribute name | CI to be used, and specified contents | Specification method |
| --- | --- | --- |
| Host | Used in an application CI. Describing the CI name of a computer (host) in which the application is installed. | In accordance with host CI naming rules |
| Type | Used in an application CI. Describing the type of the application. | Exchange Server/Active Directory and the like |
| Credibility | Describing the reliability degree of the information contents of the CI. | Proven: Given to a normal CI<br>Analogized: Given to an analogized CI<br>Unknown: Given to an unknown CI |
| IPAddress | Used in an application CI. Describing the IP address given to the application (a computer in which the application is installed). | In accordance with IP address naming rules |
| Port[ ] | Used in an application CI. Describing a port number corresponding to the application. | In accordance with port number naming rules |

TABLE 1-continued

| Attribute name | CI to be used, and specified contents | Specification method |
|---|---|---|
| Process[ ] | Used in an application CI. Describing a process identifier (number) for which the application is being executed. | In accordance with process identifier naming rules |
| LogicalConnection[ ] | Used in an application CI and describing a CI name corresponding to logical connection of the application. | In accordance with logical connection CI naming rules |
| FromAppServer | Used in a logical connection CI. Describing the connection-source application CI name of the logical connection. | In accordance with application CI naming rules |
| FromIp | Used in a logical connection CI. Describing the IP address of the connection-source application CI of the logical connection. | In accordance with the IP address naming rules |
| FromPort | Used in a logical connection CI. Describing the port number of the connection-source application CI of the logical connection. | In accordance with the port number naming rules |
| ToAppServer | Used in a logical connection CI. Describing the connection-destination application CI name of the logical connection. | In accordance with the application CI naming rules |
| ToIp | Used in a logical connection CI. Describing the IP address of the connection-destination application CI of the logical connection. | In accordance with the IP address naming rules |
| ToPort | Used in a logical connection CI. Describing the port number of the connection-destination application CI of the logical connection. | In accordance with the port number naming rules |

The analogical discovery processing section 235 analogizes configuration information about a component in the management target system for which acquisition of its configuration information is restricted (which may be referred to as a "discovery-restricted component" in the embodiment of the present invention) and executes processing for forming a CI using the analogized configuration information. The analogical discovery processing section 235 of the embodiment of the present invention includes a discovery-restricted component identification section 250, a pattern search section 255 and an analogized CI formation section 260.

In the embodiment of the present invention, such processing may be referred to as "analogical discovery", and a CI formed on the basis of configuration information analogized as a result of the analogical discovery processing may be referred to as an "analogized CI". Furthermore, in the embodiment of the present invention, a CI formed on the basis of configuration information acquired by normal discovery processing may be referred to as a "normal CI". Furthermore, in the embodiment of the present invention, a CI which is generated in the process of forming an analogized CI, on which analogized configuration information has not been reflected yet, and which is for expressing the existence of a component, may be referred to as an "unknown CI".

The discovery-restricted component identification section 250 identifies the existence of a discovery-restricted component on the basis of configuration information about other components obtained by normal discovery and which are not discovery-restricted components. The configuration information about these other components is acquired by accessing the CMDB 230. More specifically, by acquiring connection information related to a discovery-restricted component from a CI referred to as a "logical connection CI", among the configuration information about the other components, the discovery-restricted component identification section 250 identifies the existence of the discovery-restricted component.

The pattern search section 255 searches for such an analogy pattern template that configuration information about the other components related to a discovery-restricted component for which configuration information is to be analogized satisfies the set of conditions for the pattern template, from a set of analogy pattern templates which are pattern data stored in the analogy pattern database 240 to be described later. The details of this search will be described later with the use of FIGS. 4 and 8.

The analogized CI formation section 260 forms analogized configuration information about a discovery-restricted component using attribute values associated with the analogy pattern template retrieved by the pattern search section 255 and forms an analogized CI using the analogized configuration information. The details of formation of such an analogized CI will be described later with the use of FIGS. 4, 7 and the like.

The analogy pattern template database 240 stores a set of analogy pattern templates which are pattern data for analogizing configuration information about a component for which acquisition of the configuration information is restricted. An analogy pattern template is associated with a set of one or more conditions for determining whether or not to use the pattern template and attribute values for forming analogized configuration information when the set of conditions is satisfied. A concrete example of the analogy pattern template will be described later in detail with the use of FIG. 8.

The configuration management application 245 is application software for controlling each function of the discovery server 105 to perform configuration management. A system administrator or a user accesses the configuration management application 245 by operating the operator console 110 and operates each function of the discovery server 105. The configuration management application 245 also has a function of displaying configuration information analogized about a discovery-restricted component on the display device of the operator console 110 together with configuration information about other components. Specifically, the configuration management application 245 can integrally display information about normal CIs, analogized CIs and unknown CIs stored in the configuration management database (CMDB) 230 at the same time. In this case, the configuration management application 245 performs display control so that the administrator or the user can recognize that the normal CIs, the analogized CIs and the unknown CIs are normal CIs, analogized CIs and unknown CIs, respectively.

Figure 3:
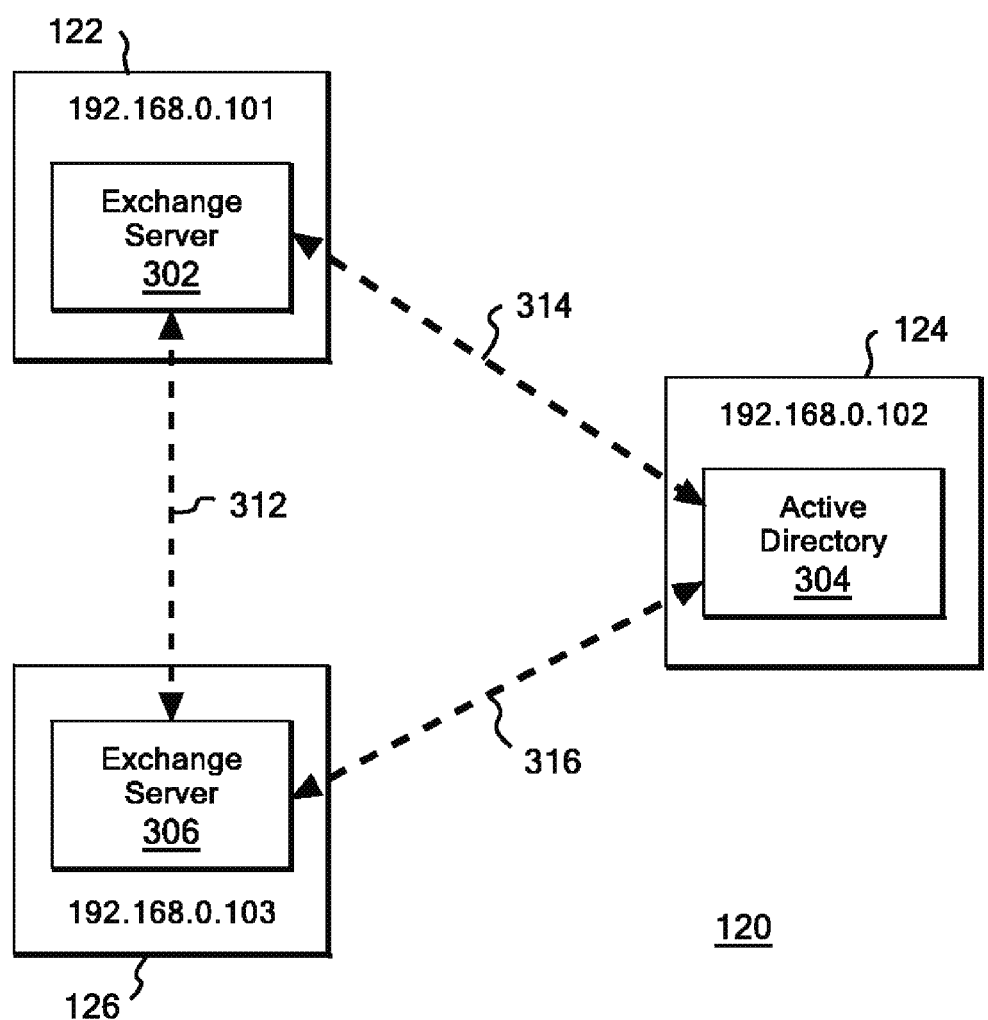
FIG. 3 is a functional block diagram of a management target system in the embodiment of the present invention.

FIG. 3 is a functional block diagram of the management target system 120 in the embodiment of the present invention. In the server 122 (IP address: 192.168.0.101), Exchange Server 302, a software product provided by Microsoft Corporation, is installed. In the server 124 (IP address: 192.168.0.102), Active Directory 304, a software product provided by Microsoft Corporation, is installed. In the server 126 (IP address: 192.168.0.103), Exchange Server 306, a software product provided by Microsoft Corporation, is installed. Logical connection relations 312, 314 and 316 exist among these installed software products.

Figure 4:
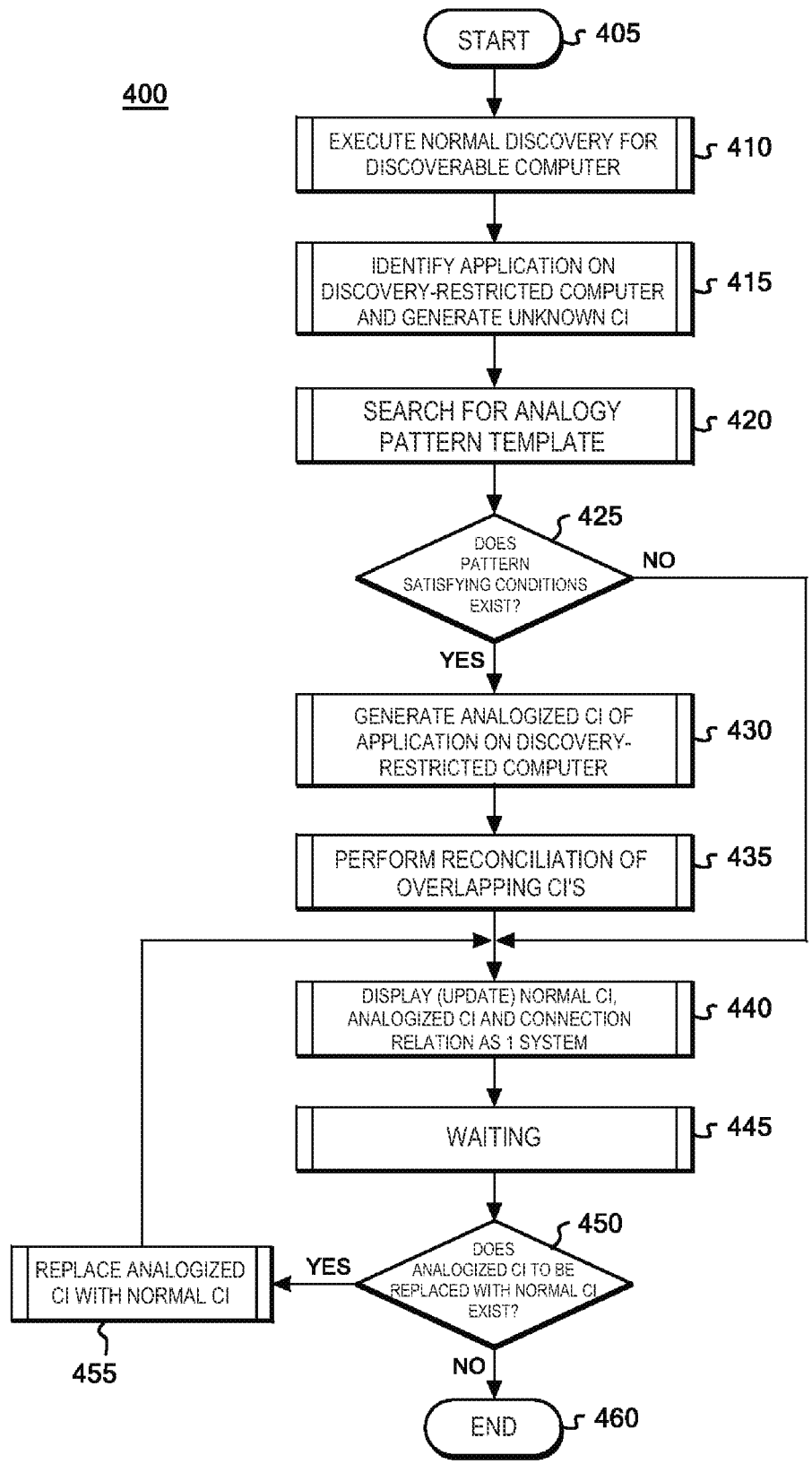
FIG. 4 is a flowchart expressing the operation of the information processing system in the embodiment of the present invention.
Figure 5:
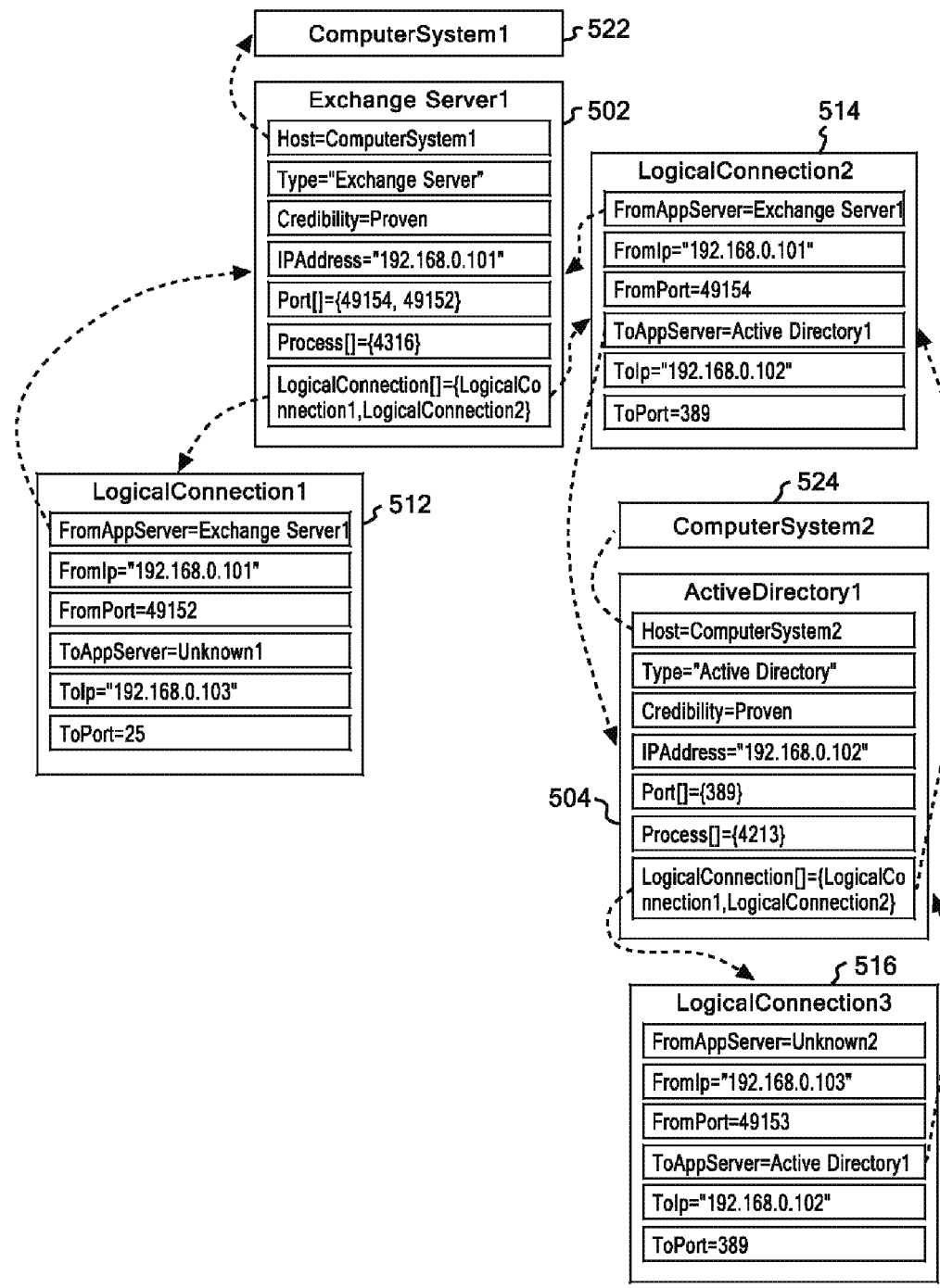
FIG. 5 shows an example of components stored in a configuration management database in the embodiment of the present invention.

FIG. 4 is a flowchart 400 expressing the operation of the information processing system in the embodiment of the present invention. The process starts at step 405, and normal discovery is performed for a discoverable computer at step 410. FIG. 5 expresses a CI generated in the CMDB 230 when step 410 is executed in the embodiment of the present invention.

FIG. 5 shows an example of CIs stored in the configuration management database (CMDB) in the embodiment of the present invention when step 410 of FIG. 4 is executed. FIG. 5 includes a total of seven CIs 522, 524, 502, 504, 512, 514 and 516.

The CIs 522 and 524 express hardware elements of the servers 122 and 124 of FIG. 1, respectively, and they are given CI names "ComputerSystem1" and "ComputerSystem2", respectively. In the embodiment of the present invention, this type of CI is referred to as a "hardware CI" herein. It should be noted that the attribute values of the CIs 522 and 524 are not important and, therefore, omitted in the embodiment of the present invention.

The CIs 502 and 504 express applications installed in the servers 122 and 124 of FIG. 1, and they are given CI names "ExchangeServer1" and "ActiveDirectory1", respectively. In the embodiment of the present invention, this type of CI is referred to as an "application CI" herein. In the embodiment of the present invention, the attributes Host, Type, Credibility, IPAddress, Port[ ], Process[ ] and LogicalConnection[ ] are described in the CIs 502 and 504 which are application CIs.

The CIs 512, 514 and 516 express logical connection relations among applications, and they are given CI names "LogicalConnection1", "LogicalConnection2" and "LogicalConnection3", respectively. In the embodiment of the present invention, this type of CI is referred to as a "logical connection CI" herein. In the embodiment of the present invention, the attributes FromAppServer, FromIp, FromPort, ToAppServer, ToIp and ToPort are described in the CIs 512, 514 and 516 which are logical connection CIs.

In a sever in which the Windows' operating system is installed, a logical connection CI can be generated by combining information obtained by using existing WMI (Windows® Management Instrumentation) and a netstat command and performing processing thereof.

Specifically, by creating and executing a WMI script using a "Win32_Service" class, a Windows® service name and a Windows® process ID (for example, "MSExchangeTransport" and "4316") can be acquired as output. Since such a WMI script can be implemented by one skilled in the art as appropriate, it is not described in detail here.

By executing the netstat command, an IP address, a port number and a related process ID can be acquired. An example of a result of executing the netstat command is shown below.

>netstat-nao

| Proto | LocalAddress | ForeignAddress | State | PID |
|---|---|---|---|---|
| TCP | 192.168.0.1:49154 | 192.168.0.2:389 | ESTABLISHED | 4316 |
| TCP | 192.168.0.1:49152 | 192.168.0.3:25 | ESTABLISHED | 4316 |

In a sever in which the UNIX® operating system is installed, a logical connection CI can be generated by combining information obtained by using existing ps and lsof commands and performing processing thereof. Specifically, an executable file name and a process ID are acquired with the use of the ps command, and an IP address, a port number and a related process ID can be acquired with the use of the lsof command.

A general discovery method for an application CI is well known, and when reading it together with the above disclosure, one skilled in the art can perform formation of the normal CI of the embodiment of the present invention, including formation of other attributes, as appropriate. Therefore, further details will not be described here.

Figure 6:
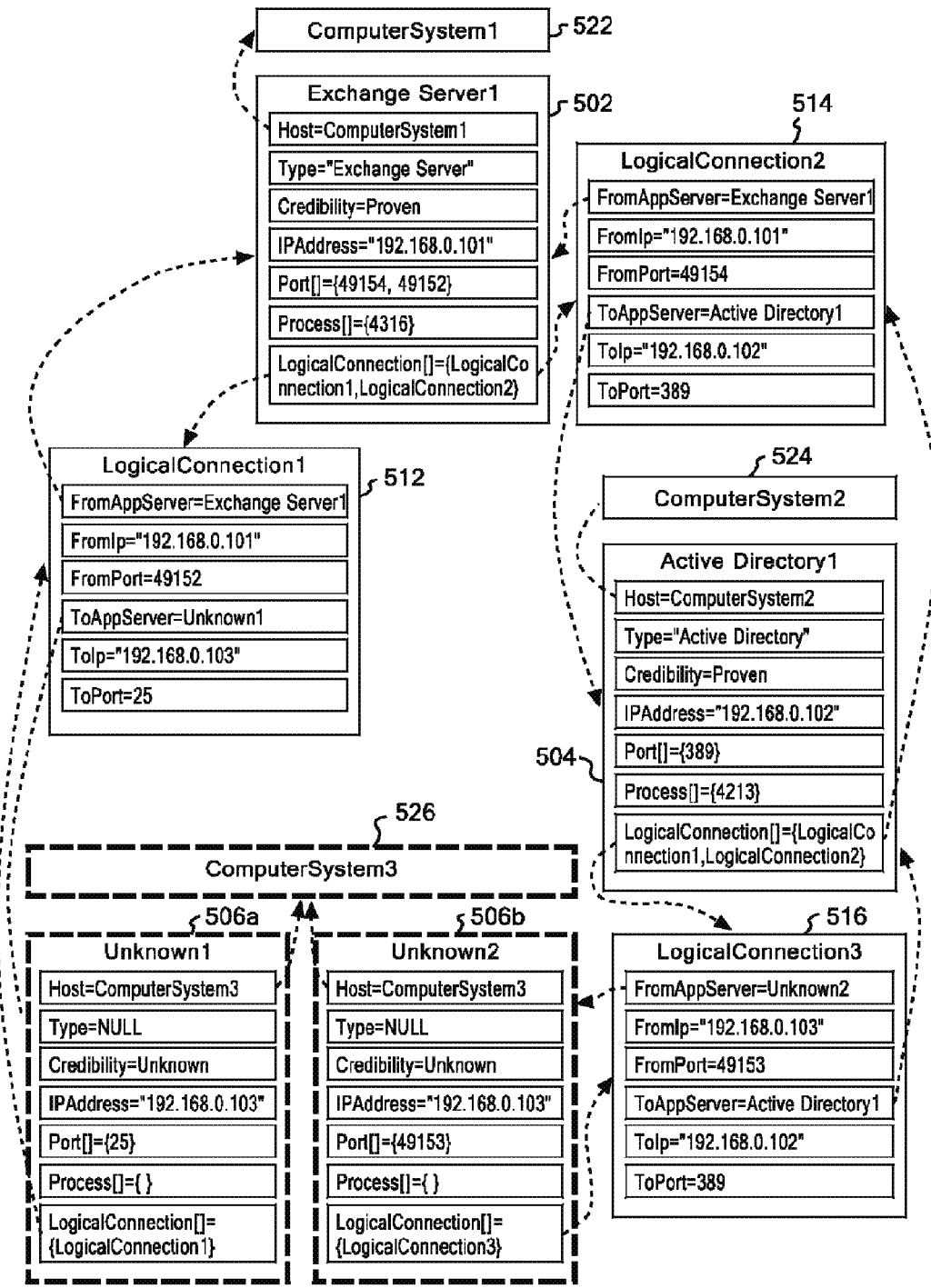
FIG. 6 shows an example of components stored in the configuration management database in the embodiment of the present invention.

Returning to the flowchart 400 in FIG. 4, the process proceeds to step 415, where unknown CIs are generated for an application on a discovery-restricted computer on the basis of information included in the logical connection CIs. FIG. 6 expresses CIs recorded in the CMDB when step 415 of FIG. 4 is executed in the embodiment of the present invention.

FIG. 6 shows an example of the components (CIs) stored in the configuration management database (CMDB) in the embodiment of the present invention when step 415 of FIG. 4 is executed. It should be noted that, in FIG. 6, unknown CIs 506a, 506b and 526 are included in addition to the CIs 522, 524, 502, 504, 512, 514 and 516.

In the embodiment of the present invention, the CIs 506a and 506b, which are unknown CIs, are formed as shown below. That is, an unknown CI is generated when the attribute ToAppServer or FromAppServer in a logical connection CI takes a value Unknown (the connection destination being unknown). Then, the logical connection CI is specified for the LogicalConnection attribute of the generated CI, and the value of ToIp or FromIp and the value of ToPort or FromPort in the logical connection CI are specified for the IPAddress and Port attributes. For the Type and Credibility attributes, "NULL" and "Unknown" are set, respectively. Then, an inherent Host attribute value is automatically generated for the IP address. After that, a hardware CI ("ComputerSystem3" here) is generated with the use of the Host attribute value generated automatically.

Returning to the flowchart 400 in FIG. 4, the process proceeds to step 420, where matching between the one or more analogy pattern templates stored in the analogy pattern template database 240 of FIG. 2 and the CIs in the CMDB, including unknown CIs, is executed to search for an analogy pattern template which satisfies conditions.

Figure 8:
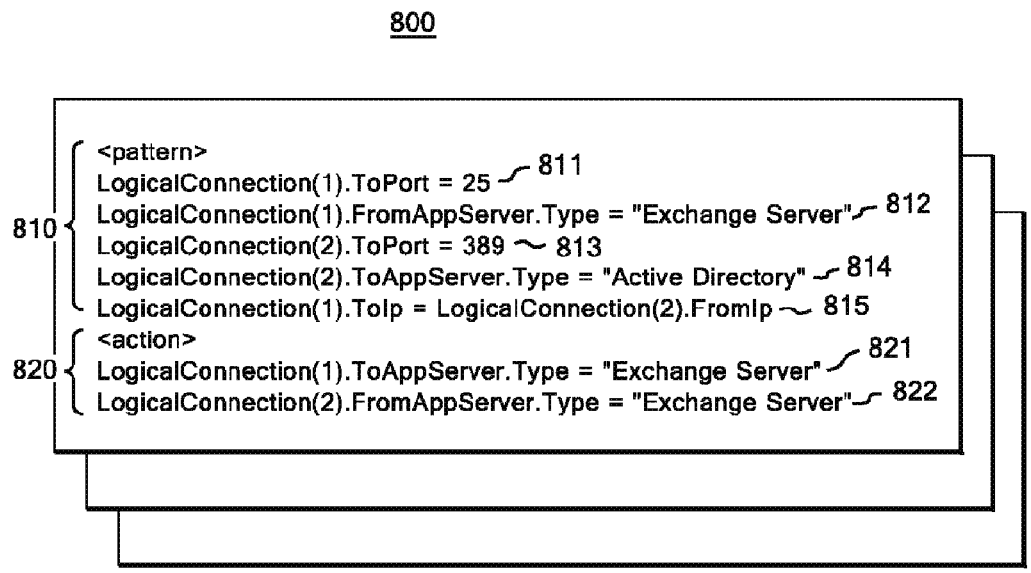
FIG. 8 shows an example of an analogy pattern template in the embodiment of the present invention.

FIG. 8 shows an example of a pattern template in the embodiment of the present invention. Each of pattern templates 800a to 800n of the present invention includes a set of conditions 810 and actions 820. The set of conditions 810 of the embodiment of the present invention is a set of conditions to be used to analogize the type of an unknown CI. The actions 820 define actions to be executed when the set of conditions 810 is satisfied. Specifically, in the embodiment of the present invention, an action of assigning an associated attribute value to the Type attribute of a corresponding unknown CI when the set of conditions 810 is satisfied is defined.

The meanings the individual conditions included in the set of conditions 810 of the pattern template 800a, which is one of the pattern templates stored in the analogy pattern template database of the embodiment of the present invention, are as shown below. In the embodiment of the present invention, when all conditions 811, 812, 813, 814 and 815 are satisfied, it is judged that the set of conditions 810 is satisfied.

Condition 811: The value of the ToPort attribute of a logical connection CI (LogicalConnection(1)) which a certain unknown CI has as the LogicalConnection attribute should be "25".

Condition 812: The Type attribute of an application CI indicated by the FromAppServer attribute of LogicalConnection(1) should be "ExchangeServer".

Condition 813: The value of the ToPort attribute of another logical connection CI (LogicalConnection(2)) which a certain unknown CI has as the LogicalConnection attribute should be "389".

Condition 814: The Type attribute of an application CI indicated by the ToAppServer attribute of LogicalConnection(2) should be "ActiveDirectory".

Condition 815: The value of the ToIp attribute of LogicalConnection(1) equals to the value of the FromIp attribute of LogicalConnection(2).

The meanings the individual actions included in the actions 820 of the pattern template 800a of the embodiment of the present invention are as shown below.

Condition 821: Set the Type attribute of the application CI indicated by the ToAppServer attribute of LogicalConnection(1) for "ExchangeServer".

Condition 822: Set the Type attribute of the application CI indicated by the FromAppServer attribute of LogicalConnection(2) for "ExchangeServer".

As for the known CIs 506a and 506b in FIG. 6 with regard to the pattern template 800a described above, since ToPort of the logical connection CI ("LogicalConnection1") of the unknown CI 506a is "25", and the Type attribute of the application CI ("ExchangeServer1") indicated by FromAppServer is "Exchange Server", the conditions 811 and 812 are satisfied. Since ToPort of a logical connection CI ("LogicalConnection3") of the unknown CI 506b is "389", and the Type attribute of the application CI ("ActiveDirectory 1") indicated by ToAppServer is "ActiveDirectory", the conditions 813 and 814 are satisfied. Furthermore, both of ToIp of LogicalConnection1 and FromIp of LogicalConnection2 are "192.168.0.103", the condition 815 is also satisfied. Thus, the set of conditions 810 of the pattern template 800a is satisfied.

Returning to the flowchart 400 in FIG. 4, the process proceeds to step 425, where it is judged whether a pattern template satisfying the conditions exists in the pattern template database 240 of FIG. 2. If it is judged that the pattern template satisfying the condition does not exist, the process proceeds to step 440 along the NO arrow, where, for the components existing in the management target system, normal CIs, analogized CIs and connection relations among them are displayed as one system and presented to the administrator or the user.

If it is judged that a pattern template satisfying the conditions exists, the process proceeds to step 430 along the YES arrow, where an action of a pattern template retrieved as a result of the pattern template satisfying the set of conditions is executed for the application on the discovery-restricted computer, and an analogized CI is generated. This processing is performed by changing the Type attribute of the unknown CIs from "NULL" to a related attribute value ("Exchange Server" in this concrete example) described in the pattern template satisfying the conditions and changing the Credibility attribute from "Unknown" to "Analogized".

Next, the process proceeds to step 435, where reconciliation of multiple overlapping CIs is executed in accordance with reconciliation rules stored in the discovery server. The reconciliation in the embodiment of the present invention includes integration of analogized CIs which have been generated from multiple existing unknown CIs for the substantially same application in the case where a set of conditions is satisfied.

In the embodiment of the present invention, it is assumed that a reconciliation rule is set that, when multiple application CIs the Type attributes of which are "Exchange Server" have the same IP address, the multiple application CIs are integrated. In the embodiment of the present invention, since both of an analogized CI generated from the unknown CI 506a and an analogized CI generated from the unknown CI 506b of FIG. 6 have "Exchange Server" as the Type attribute and have the same IP address ("192.168.0.103"), they are to be integrated.

Figure 7:
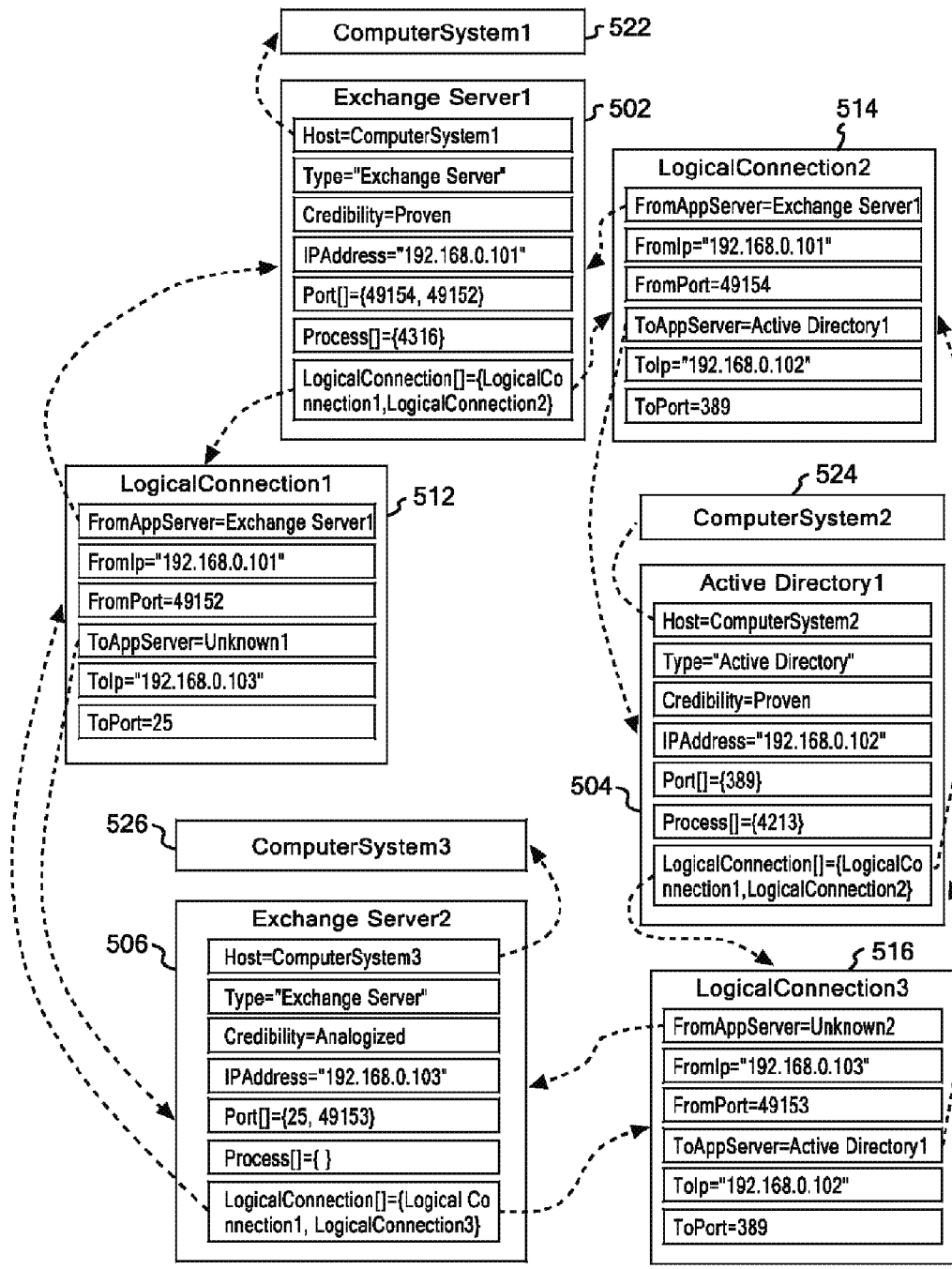
FIG. 7 shows an example of components stored in the configuration management database in the embodiment of the present invention.

FIG. 7 shows an example of components stored in the configuration management database after analogized CI generation (step 430 of FIG. 4) and reconciliation (step 435 of FIG. 4) are executed, in the embodiment of the present invention. It should be noted that a CI 506, which is a single analogized CI, is newly generated, that "Exchange Server" exists as the Type attribute, and that the Credibility attributed has been changed to "Analogized". It should further be noted that, in FIG. 7, newly generated CI 506 is included in addition to the CIs 522, 524, 526 502, 504, 512, 514 and 516.

Figure 9:
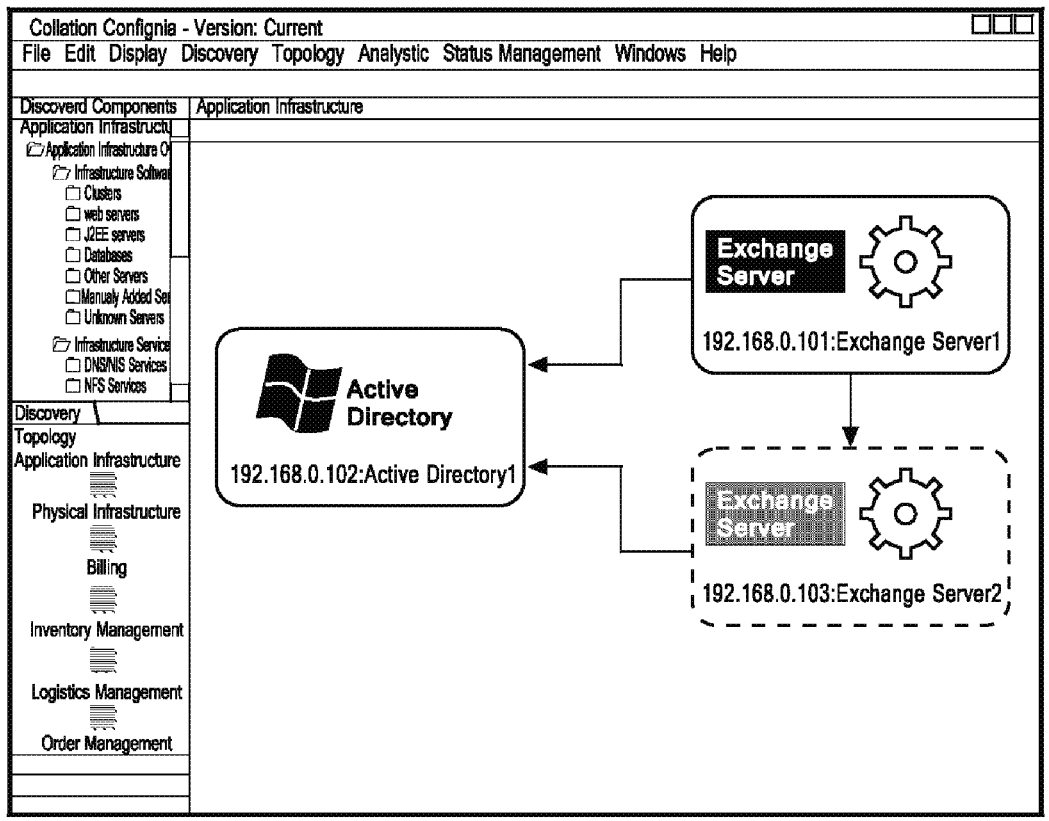
FIG. 9 shows an example of the graphical user interface of a configuration management application program of the embodiment of the present invention.

Returning to the flowchart 400 in FIG. 4, the process proceeds to step 440, where, for the components existing in the management target system, normal CIs, analogized CIs and connection relations among them are displayed as one system and thereby presented to the administrator. FIG. 9 shows an example of the graphical user interface of the configuration management application program of the embodiment of the present invention for performing such display. It should be noted that an application CI, which is an analogized CI, is surrounded by a broken line so that the administrator knows that it is an analogized CI.

Returning to the flowchart 400 in FIG. 4, the process proceeds to step 445 and waits until an analogized CI to be replaced with a normal CI is generated. It is judged at step 450 whether an analogized CI to be replaced with a normal CI exists or not, by removing discovery restriction or the user inputting an actual attribute value or the like. If it is judged at step 450 that such an analogized CI exists, then the process proceeds to step 455 along the YES arrow, where the analogized CI is replaced with a normal CI. On the other hand, if it is judged at step 450 that such an analogized CI does not exist, then the process proceeds to step 460 and ends.

Figure 10:
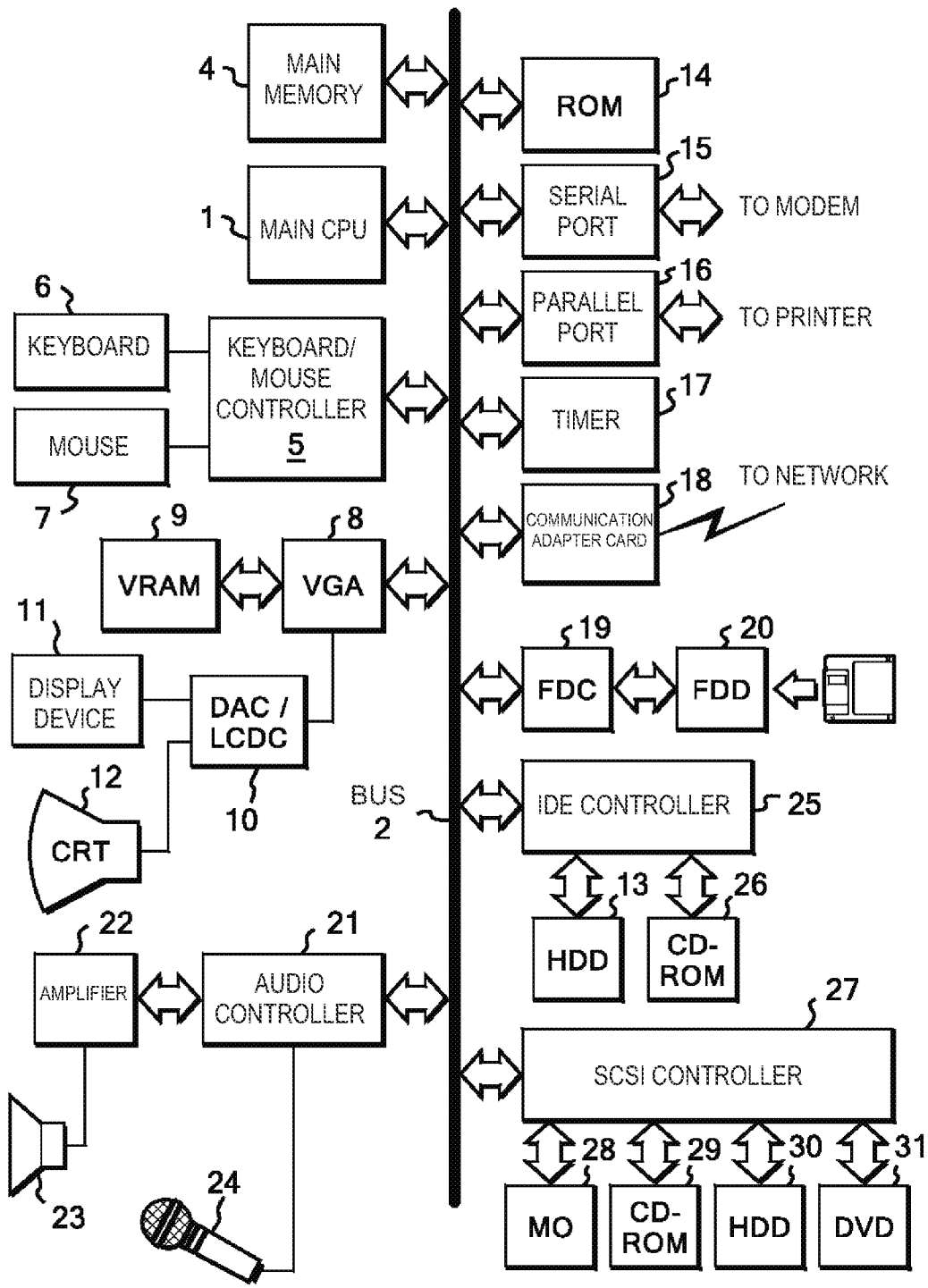
FIG. 10 is a diagram showing an example of the hardware configuration of an information processing device preferable for realizing computer elements included in a data processing system in the embodiment of the present invention.

FIG. 10 is a diagram showing an example of the hardware configuration of an information processing device preferred to realize a computer element, such as a discovery server, included in the information processing system in the embodiment of the present invention. The information processing device includes a CPU (central processing unit) 1 and a main memory 4 which are connected to a bus 2. Hard disk devices 13 and 30, and removable storages (external storage systems for which a storage media can be exchanged), such as CD-ROM devices 26 and 29, a flexible disk device 20, an MO device 28 and a DVD device 31, are connected to the bus 2 via a Floppy® disk controller 19, an IDE controller 25, an SCSI controller 27 and the like.

Storage media like a flexible disk, MO, CD-ROM and DVD-ROM are inserted into the removal storages. A computer program code for giving commands to the CPU and the like to practice the present invention in cooperation with the operating system can be recorded in the storage media, the hard disk devices 13 and 30, and a ROM 14. The computer program is executed by being loaded onto the main memory 4. The computer program can be compressed or divided into multiple parts to be recorded in multiple media.

The information processing device receives an input from an input device such as a keyboard 6 and a mouse 7, via a keyboard/mouse controller 5. The information processing device is connected to a display device 11 and/or cathode ray tube 12 for presenting visual data to a user, via a DAC/LCDC 10 and video graphics adapter 8, which utilizes video random access memory 9. Likewise, the information processing device is connected to a speaker 23 for presenting audio data to a user via amplifier 22 and audio controller 21, which is also capable of receiving audio information from the user via microphone 24 and transmitting the audio information to the information processing device. Additionally, the information processing device is able to transmit data to a modem or printer via serial port 15 and parallel port 16, respectively. All of the transmission of data to the various devices may be controlled via a timer, such as timer 17.

The information processing device is capable of connecting to a network via a network adaptor 18 (such as an Ethernet® card and a token ring card) or the like to communicate with other computers and the like. It is also possible to connect the information processing device to a printer via a parallel port or connect a modem to the information processing device via a serial port.

From the above description, it will be easily understood that the information processing device preferred to realize a discovery server and the like according to the embodiment of the present invention is readily realized by an information processing device such as a common personal computer, workstation and main frame, or by combination thereof. However, these components are only examples, and all of the components are not necessarily essential components of the present invention.

Of course, one skilled in the art can easily conceive of various modifications, such as implementing the hardware configuration elements of the information processing device used in the embodiment of the present invention by combining multiple machines and distributing functions to the machines. Such a modification is a concept to be naturally included in the idea of the present invention.

The discovery server and the like of the embodiment of the present invention adopt an operating system supporting a GUI (graphical user interface) multi-window environment like the Windows' operating system provided by Microsoft Corporation, the MacOS® provided by Apple Computer Incorporated, and a UNIX® system equipped with the X Window System (for example, AIX® provided by International Business Machines Corporation).

From the above, it is understood that the discovery server and the like used in the embodiment of the present invention are not limited to a particular multi-window operating system environment.

According to the embodiment of the present invention, it is realized to provide an improved system, method, program and program product for managing configuration information about components of a management target system, capable of forming a CI using analogized configuration information even for a discovery-restricted component. Therefore, it is easily understood that it is possible to enhance the productivity of an administrator or a user of the management target system.

The present invention can be realized as hardware, software or combination of hardware and software. As execution by combination of hardware and software, execution in a data processing system having a predetermined program can be given as a typical example. In such a case, by the predetermined program being loaded onto the data processing system and executed, the program controls the data processing system to execute the process according to the present invention. This program is configured by a group of commands which can be expressed in an arbitrary language, code and expression. Such a group of commands enables the system to execute a particular function directly or after any one of 1. conversion to another language, code and expression and 2. copying to another medium or both of them are performed.

Of course, the present invention includes not only the program itself but also a medium in which the program is recorded within its scope. The program for executing the functions of the present invention can be stored in any computer-readable recording medium such as a flexible disk, MO, CD-ROM, DVD, hard disk device, ROM, MRAM and RAM. The program can be downloaded from another data processing system connected via a communication line to be stored into a recording medium or copied from another recording medium. Furthermore, the program can be compressed or divided into multiple parts to be recorded into multiple media. It should be noted that it is, of course, possible to provide a program product for practicing the present invention in various forms.

It is apparent to one skilled in the art that various kinds of modifications and improvements can be made in the above embodiment. For example, though logical connection relations existing among components in a management target system are expressed with the use of "logical connection CIs" in the embodiment of the present invention, it is also possible to describe such logical connection relations in CIs corresponding to components having the logical connection relations as relation attributes and use them to form an unknown CI or search for an analogy pattern template. Such a modified or improved embodiment is naturally included in the technical scope of the present invention.

The invention claimed is:

1. A method in a system for forming configuration information about components of a system which includes a first component for which acquisition of configuration information is restricted, the method comprising:
    identifying the existence of the first component from configuration information about one or more other components except the first component;
    retrieving, from a storage storing pattern data for analogizing configuration information about a component for which acquisition of the configuration information is restricted, the pattern data being associated with a set of one or more conditions and one or more attribute values, such pattern data that configuration information about a component related to the first component, among the one or more other components, satisfies the set of conditions; and
    forming analogized configuration information about the first component using one or more attribute values associated with the retrieved pattern data.

2. The method according to claim 1, further comprising:
    storing the configuration information about the one or more other components and the analogized configuration information about the first component as CIs (configuration items) in a configuration management database.

3. The method according to claim 2, wherein a CI expressing the existence of the first component is formed in the configuration management database in response to the existence of the first component having been identified.

4. The method according to claim 3, wherein, when multiple CIs expressing the existence of the first component are formed, the multiple CIs are integrated in response to the analogized information having been formed.

5. The method according to claim 1, wherein the identification of the existence of the first component is identified from connection information related to the first component, among the configuration information about the one or more other components.

6. The method according to claim 1, wherein the analogized configuration information is stored together with data indicating that the configuration information is analogized information.

7. The method according to claim 1, further comprising:
displaying the analogized configuration information about the first component on a display device together with the configuration information about the one or more other components.

8. The method according to claim 7, further comprising:
displaying the analogized configuration information about the first component on the display device in a manner so that it is shown that the configuration information is analogized configuration information.

9. The method according to claim 1, wherein, on condition that actual configuration information about the first component has been acquired, the method further comprises:
replacing the analogized configuration information with the actual configuration information.

10. The method according to claim 1, further comprising:
acquiring the configuration information about the one or more other components.

11. The method according to claim 1, wherein the configuration information about the one or more other components includes connection relations among components of a management target system.

12. The method according to claim 1, wherein the first component is any of a hardware element and a software element.

13. The method according to claim 1, wherein the first component is software on a discovery-restricted computer.

* * * * *